(12) United States Patent
Blankenburg et al.

(10) Patent No.: US 10,527,673 B2
(45) Date of Patent: Jan. 7, 2020

(54) HARDWARE DEBUG HOST

(71) Applicant: Microsoft Technology Licensing, LLC, Redmond, WA (US)

(72) Inventors: Garrett D. Blankenburg, Sammamish, WA (US); Michael Gordon Love, Union City, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 130 days.

(21) Appl. No.: 15/623,722

(22) Filed: Jun. 15, 2017

(65) Prior Publication Data

US 2018/0031632 A1    Feb. 1, 2018

Related U.S. Application Data

(60) Provisional application No. 62/369,653, filed on Aug. 1, 2016.

(51) Int. Cl.
*G01R 31/317* (2006.01)
*G01R 31/3177* (2006.01)

(52) U.S. Cl.
CPC ... *G01R 31/31705* (2013.01); *G01R 31/3177* (2013.01)

(58) Field of Classification Search
CPC .......... G01R 31/31705; G01R 31/3177; G06F 11/3656
See application file for complete search history.

(56) References Cited

U.S. PATENT DOCUMENTS

| 5,394,544 | A | 2/1995 | Motoyama et al. |
| 5,964,890 | A | 10/1999 | Inui et al. |
| 6,530,047 | B1 | 3/2003 | Edwards et al. |
| 6,618,854 | B1 | 9/2003 | Mann |
| 6,691,251 | B2 | 2/2004 | Wong |
| 6,904,577 | B2 | 6/2005 | Schubert et al. |
| 7,496,812 | B1 | 2/2009 | Azimi et al. |
| 7,823,131 | B2 | 10/2010 | Gard et al. |
| 7,870,455 | B2 | 1/2011 | Mayer |
| 7,913,118 | B2 | 3/2011 | Shih et al. |
| 7,979,745 | B2 | 7/2011 | Moroda |

(Continued)

FOREIGN PATENT DOCUMENTS

EP    2463780 A1    6/2012

OTHER PUBLICATIONS

"International Search Report and Written Opinion Issued in PCT Application No. PCT/US2017/044267", dated Oct. 18, 2017, 11 Pages.

(Continued)

*Primary Examiner* — Guy J Lamarre
(74) *Attorney, Agent, or Firm* — Holzer Patel Drennan

(57) ABSTRACT

A hardware debug system includes a target chip comprising one or more target chip registers and one or more target chip ports, wherein at least one of the one or more target chip ports is used as a target chip debug port, and a debug host with one or more debug host ports, wherein at least one of the one or more debug host ports is connected to the target chip debug port via a hardware debug bus, wherein the debug host is configured to load at least one target chip setting into the one or more target chip registers that enables the target chip to boot via the hardware debug port using the hardware debug bus.

20 Claims, 9 Drawing Sheets

(56) References Cited

U.S. PATENT DOCUMENTS

| | | |
|---|---|---|
| 8,407,526 B1 | 3/2013 | Righi et al. |
| 9,158,661 B2 | 10/2015 | Blaine et al. |
| 2002/0147894 A1 | 10/2002 | Barrenscheen et al. |
| 2003/0074650 A1 | 4/2003 | Akgul et al. |
| 2006/0161818 A1 | 7/2006 | Tousek |
| 2007/0094507 A1* | 4/2007 | Rush ............... H04L 63/123 713/176 |
| 2012/0278598 A1* | 11/2012 | Wang ............... G06F 21/575 713/2 |
| 2014/0059339 A1* | 2/2014 | Lee .................. G06F 8/60 713/2 |
| 2016/0139201 A1* | 5/2016 | Lin .................. G01R 31/3177 714/727 |

OTHER PUBLICATIONS

Haller, Craig A., "On-Chip Debug", Retrieved on: Jul. 22, 2016 Available at: http://www.embeddedintel.com/technology_applications.php?article=54.

"ULINK Debug and Trace Adapters", Retrieved on: Aug. 2, 2016 Available at: http://www2.keil.com/mdk5/ulink.

* cited by examiner

HARDWARE DEBUG HOST

CROSS-REFERENCE TO RELATED APPLICATIONS

The present application claims benefit of priority to U.S. Provisional Patent Application No. 62/369,653, entitled "Hardware Debug Host" and filed on Aug. 1, 2016, which is specifically incorporated by reference for all that it discloses and teaches.

BACKGROUND

Electronic systems such as a computer, a set-top box, a game console, a phone, etc., include a number of integrated circuit ("IC," also referred to as a chip). Such IC chips include a microprocessor, a graphics processor, a memory chip, a storage controller, a digital signal processor, etc. One or more settings of such chips may be provided by hardware registers and of fuses. The chips may come with default settings that are intended to allow software to start executing on the chip. Furthermore, such chips also include one or more ports that may be used for debugging the chip.

SUMMARY

The described technology includes a target chip comprising one or more target chip registers and one or more target chip ports, wherein at least one of the one or more target chip ports is used as a target chip debug port, and a debug host with one or more debug host ports, wherein at least one of the one or more debug host ports is connected to the target chip debug port via a hardware debug bus, wherein the debug host is configured to load at least one target chip setting into the one or more target chip registers that enables the target chip to boot via the hardware debug port using the hardware debug bus.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

Figure 1:
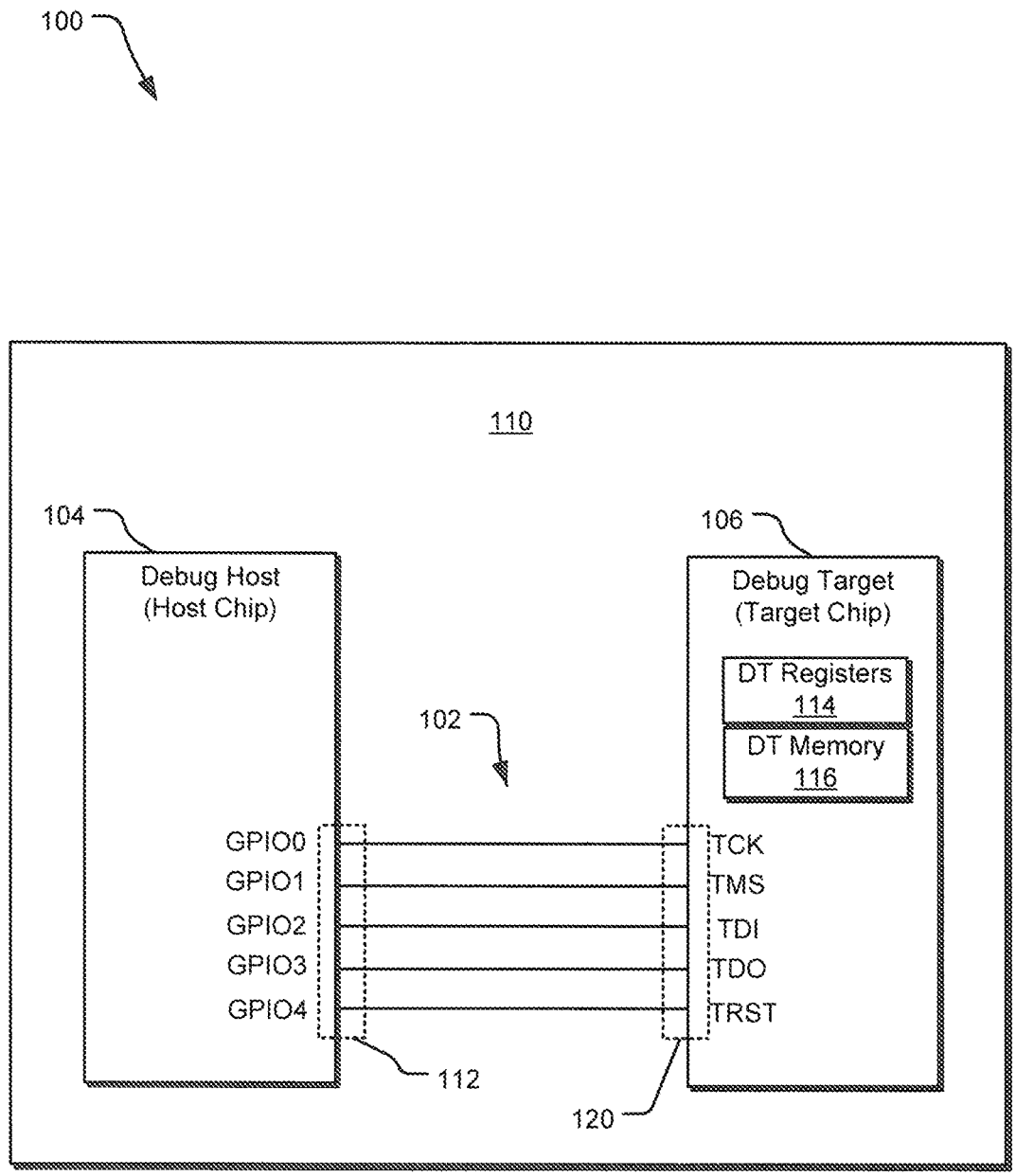
FIG. 1 illustrates an example system disclosing the hardware debug host working with a debug target.

The described technology includes a debug target comprising one or more debug target registers and one or more debug target ports, wherein at least one of the one or more debug target ports is used as a debug target debug port and a debug host with one or more debug host ports, wherein at least one of the one or more debug host ports is connected to the debug target debug port, wherein the debug host is configured to load at least one debug target setting into the one or more debug target registers that enables the debug target to boot via the hardware debug port.

An implementation of an integrated circuit (IC), sometimes called a chip or microchip, may be a semiconductor wafer on which a large number (sometime thousands or millions) of tiny resistors, capacitors, and transistors are fabricated. An IC can function as an amplifier, an oscillator, a timer, a counter, a computer memory, a microprocessor, a digital signal processor, etc. Herein, the term "chip" is used to refer to an IC.

Modern microprocessor chips include fuses that may be selectively blown during manufacturing of the microprocessor. The fuses may be selectively blown with control values that are read from the fuses to control operation of the microprocessor. Normally, when a non-blown fuse is read it returns a binary zero, and when a blown fuse is read it returns a binary one (although, of course, the convention could be reversed). For a microprocessor to operate correctly, the fuse settings are generally required to be correct or as intended. Typically, these fuses are read at the boot up of the microprocessor to validate additional bootloaders stored on in flash or other memory of the microprocessor. Therefore, to make sure that one can read the bootloader programs, the settings of the fuses should be good enough to read the bootloaders. For example, if the fuse settings are incorrect, the microprocessor chip may have to be sent back to the manufacturer to correct the settings.

The hardware debug host may be used with a closed system like a computer, set-top box, game console, phone, etc., where one chip (the debug host ("DH")) is connected to another chip (the debug target ("DT")) via the debug target's hardware debug interface (JTAG, ARM-SWD, etc.). The DT is also referred to herein as a target chip and the DH is also referred to herein as a host chip. This enables multiple capabilities including loading register settings during boot, recording low-level failure analysis information, initial imaging and updating the DT's software, enabling random access memory (RAM) only debug targets, enabling additional communication paths between DH and DT, etc.

The DH is provided on the motherboard where the DH is connected to a DT, such as a microprocessor, via a bus, such as a Joint Test Action Group (JTAG) bus (IEEE 1149.1), a serial wire debug (SWD) bus, microchip in-circuit serial programming (ICSP) bus, etc. The DH ports provide a low-level interface into the DT, allowing registers and memory of the DT to be accessed, along with other special functions like halting, stepping, resetting, etc. This configuration allows for many advanced interactions between the DH and DT. If there are any fuses in the DT that are not set correctly, the values of one or more registers are overwritten so as to provide appropriate loading of bootloader, etc. In one implementation, the DH may be plugged into the motherboard that also includes the DH and the communication bus. The DH may be able to do a soft reset of the DT.

In one implementation, the DH disclosed herein includes a number of Input/output (IO) ports to communicate with the DT. Furthermore, the DH includes code that allows it to determine values received from the IO ports, process the value to determine whether one or more fuses on the registers are set incorrectly, to determine values for one or more registers on the DT, communicate such values to the DT, etc.

FIG. 1 illustrates an example hardware debug system 100 disclosing a DH 104 working with a DT 106. The DH 104 may communicate with the DT 106 via a communication bus 102. The DH 104 may have several general-purpose IO (GPIO) ports 112. These GPIO ports 112 may be connected to debug target ports 120 on the DT 106. One or more of such debug target ports 120 may be hardware debug ports. For example, for the DT 106 using joint test action group (JTAG) standard, the debug target ports 120 may include hardware debug ports including a TCK (test clock), TMS (test mode select), TDI (test data in), TDO (test data out), TRST (test reset), etc. In such an implementation, the communication bus 102 may be configured as a JTAG bus.

In one implementation, some of the GPIO ports 112 may be connected to the hardware debug ports of the DT ports 120. In one implementation, the GPIO signals are tri-stated at the time they are not in use. This allows plugging a JTAG debugger to work with the DT 106. In other words, the JTAG debugger may share the communication bus 102, functioning as a JTAG bus, with the DH 104. For example, the communication bus 102 may be used with a third party off-the-shelf hardware debug device. The hardware debug system 100 may be implemented on a closed system 110, such as a game console, a computer, a mobile device, a set-top box, etc.

The DT 106 includes one or more DT registers 114 and DT memory 116. For example, the DT memory 116 may be RAM. The hardware debug system 100 allows the DH 104 to use the communication bus 102 to load one or more DT settings into the DT registers 114. Specifically, the DH 104 may load optimized register settings to the DT registers 114 using the communication bus for use during boot-up of the DT 106. Alternatively, the DH 104 may also be able to load DT registers 114 that allows recording of low-level failure analysis information for the DT 106. Furthermore, the DT registers 114 may be loaded to assist in initial imaging and updating the software on the DT 106, enabling debug targets for DT memory 116 only, and enabling additional communication paths between DH 104 and DT 106.

The hardware debug system 100 allows changing the DT registers 114 by the DH 104 so that if the DT registers 114 come with a default setting. Specifically, such default settings of the DT register are intended to allow software to start executing on the DT 106. Allowing the changing any incorrect settings of the DT registers ensures the software can start successfully on the DT 106.

Furthermore, the hardware debug system 100 also allows the DH 104 to load software on the DT memory 116 using the communication bus 102 connected to the debug target ports 120. As a result, it avoids the necessity of additional non-volatile memory from which such software is loaded to the DT memory 116, thus reducing cost. Additionally, if the software on the DT 106 is in a corrupt state, such as functioning in an infinite loop, the hardware debug system 100 may allow recovering from such faulty functioning by loading DT registers 114 such that the software may be interrupted.

Figure 2:
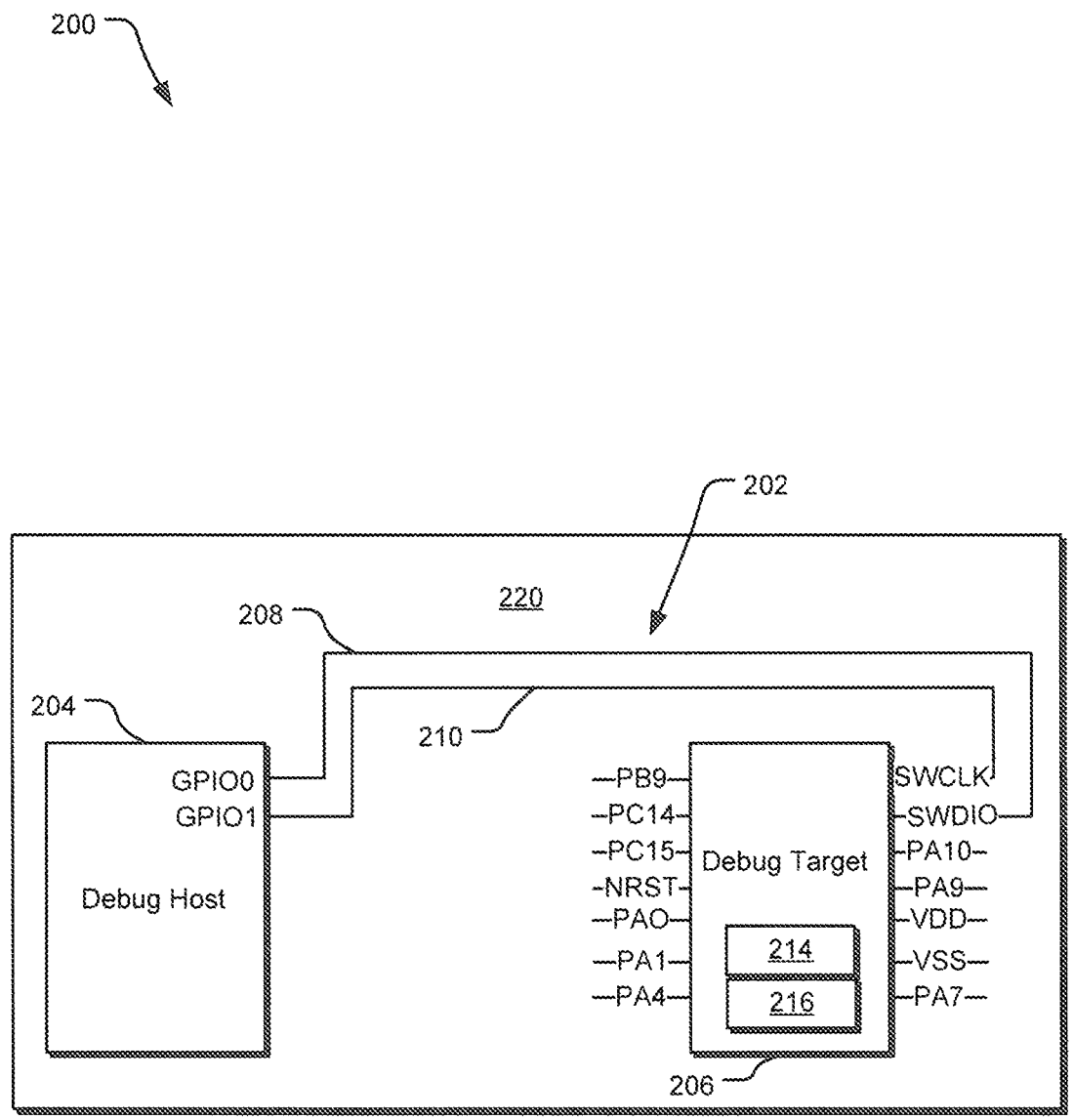
FIG. 2 illustrates an alternative example system disclosing the hardware debug host working with a debug target.

FIG. 2 illustrates an alternative example system 200 disclosing a DH 204 working with a DT 206. For example, the DH 204 may be an intelligent system on chip (SOC) and the DT 206 may be a 16-pin microcontroller. The DH 204 may communicate with the DT 206 using a serial wire debug (SWD) bus 202. In the illustrated implementation, the SWD bus 202 includes two signal wires 208 and 210. Specifically, a GPIO of the DH 204 may communicate via the signal wire 208 with a serial wire clock (SWCLK) pin on the DT 206 and another GPIO of the DH 204 may communicate via the signal wire 210 with a serial wire data input/output (SWDIO) pin on the DT 206. This allows the DH 204 access to DT registers 214 and DT memory 216 (such as a flash memory) of the DT 206. The SWD bus 202 may also be tri-stated so that a debugger system may be connected to the SWCLK and SWDIO pins of the DT 206.

In one implementation, the hardware debug system 200 also allows the DH 204 to set up a break point before some code on the DT memory 216 so as to vector off to an alternate code stored in an alternative location on the DT memory 216. Such capability to vector off to other code allows sidestepping defective hardware or software on the DT 206. Specifically, if it is determined that the software on the DT 206 is not functioning properly, the DH 204 may be able to load new code to the DT memory 216 using the SWD bus 202 and then instruct the DT registers 214 to cause the code to vector off to the newly loaded code. This allows dynamic debugging of the functioning of the DT 206 using the SWD bus 202 and the SWD ports (SWCLK and SWDIO) on the DT 206. The hardware debug system 200 may be implemented on a closed system 220, such as a game console, a computer, a mobile device, a set-top box, etc.

Figure 3:
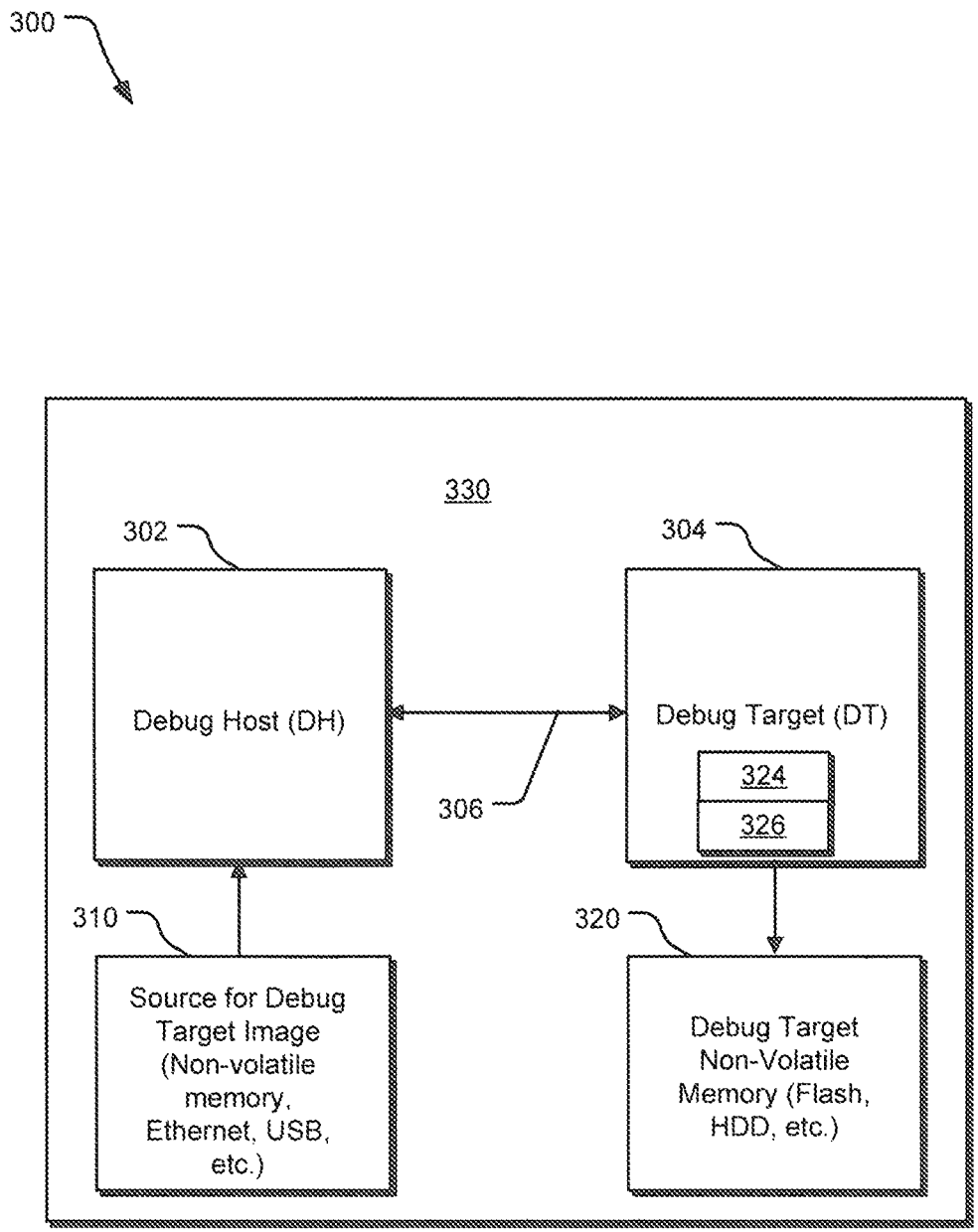
FIG. 3 illustrates another alternative example system disclosing the hardware debug host working with a debug target.

FIG. 3 illustrates another alternative example hardware debug system 300 disclosing a DH 302 working with a DT 304. Specifically, the hardware debug system 300 allows debugging software on the DT 304 using the DH 302. For example, the DH 302 may communicate with the DT 304 using a hardware debug interface 306, such as JTAG, SWD, etc. The DH 302 may be connected to DH memory 310 and the DT 304 may be connected to DT memory 320. For example, the DH memory 310 may be non-volatile memory or some other source that stores an image of the DT 304. The DT memory 320 may be non-volatile or volatile memory.

The DH 302 may realize that the DT 304 does not have some software (using some sort of communication via the hardware debug interface 306). In such a case, the DH 302 may program an algorithm on the DT 304 over the hardware debug interface 306, such as bootloader program, etc. Specifically, the DH 302 may download such algorithm onto one or more registers 324 of the DT 304. The DT 304 may start executing the bootloader loaded by the DH 302, where the bootloader may know how to perform other functions of the DT 304. The DH 302 may start walking through the code or algorithm stored in the memory 310 and load it into the DT memory 320 over the hardware debug interface 306. The DH 302 may also set certain flags or the registers 324 on the DT 304 where one or more such flag may point that the certain code for the DT 304 is in the DT memory 320. In such a case, in response to the settings of the flag on the DT 304, the DT 304 may start executing such code, such as a bootloader, from the DT memory 320.

In one implementation, the DH 302 may load code into the volatile memory 326 of the DT 304 and this case the DT 304 may not need the non-volatile DT memory 320. Given that the hardware debug interface 306, such as JTAG are implemented at a much lower level with less complexity, it provides ease of communication between the DH 302 and the DT 304. For example, the hardware debug interface 306 may communicate at the rate of about 800 KB/sec, which allows for fast loading of code, such as bootloader, into the DT 304. In one implementation, the hardware debug interface 306 operates at the physical layer of communication protocol between the DH 302 and the DT 304.

Figure 4:
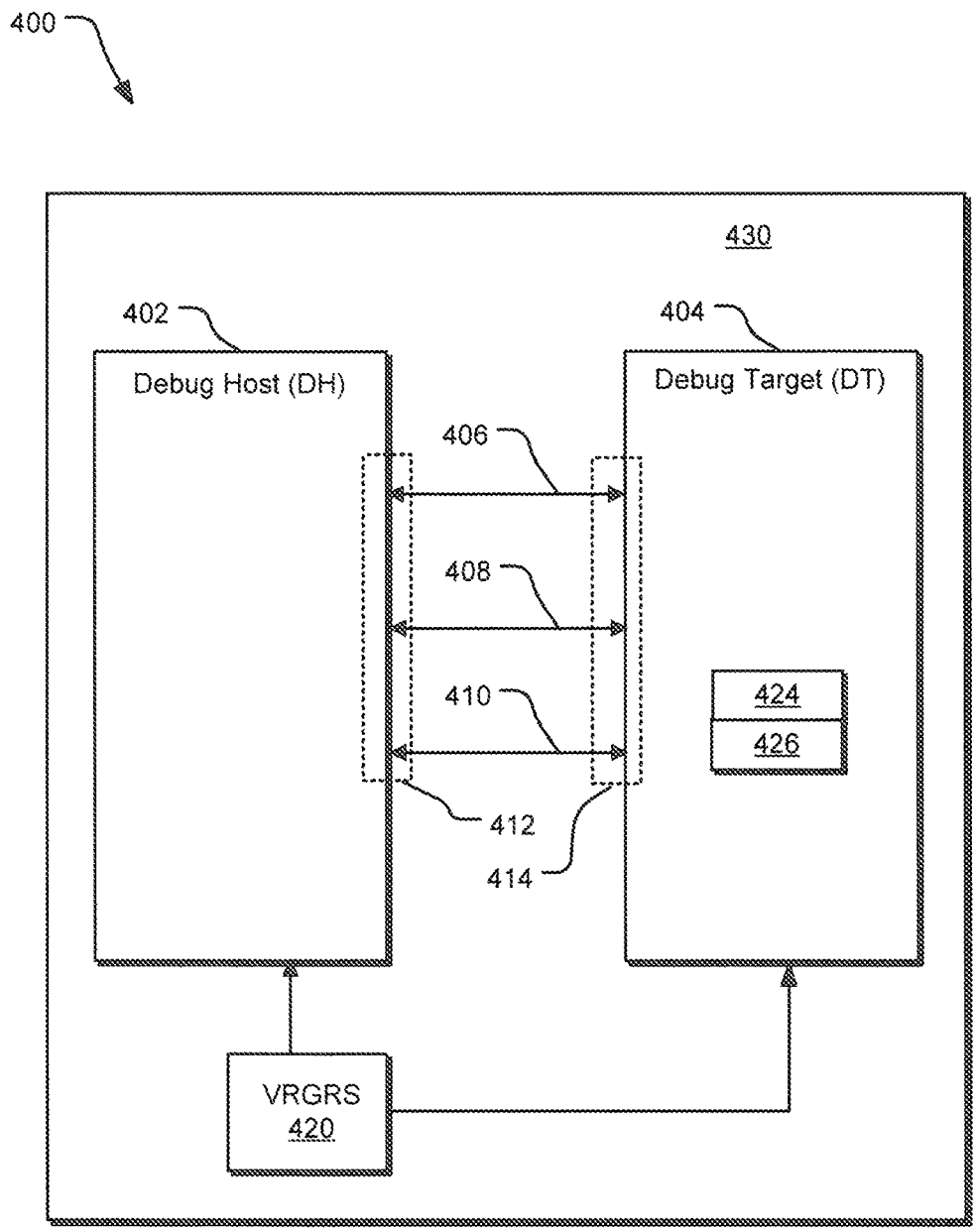
FIG. 4 illustrates another alternative example system disclosing the hardware debug host working with a debug target.

FIG. 4 illustrates another alternative example of a hardware debug system 400 disclosing a DH 402 working with a DT 404. The implementation of the hardware debus system 400 allows a DH 402 to use low level communication buses including a JTAG bus 406, an inter integrated chip (I2C or $I^2C$) bus 408, and a RESET line 410 to communicate with a DT 404 to initiate a software boot on the DH 404.

The DH 402 is programmed to generate correct waveforms on the debug ports 412 of the DT 404 to perform or more functions. A voltage regulator 420 may be used to set the power for each of the DH 402 and the DT 404. The DH 402 may send a negate hardware reset signal over RESET 410 to one of the ports 414 of the DT 404. In response, the DH 404 boots from a read only memory (ROM) 426. If any initial peripheral state as set in registers 424 of the DT 404 is invalid, such boot may fail. The DH 402 may patch register states of the DT 404 using a JTAG bus 406. In one implementation, the JTAG bus 406 may include four signals TCK, TMS, TD0, and TD1. Subsequently, the DT 402 reads any message sent by the DT 404 over an I2C bus 408 to determine if a software boot acknowledge is received.

Figure 5:
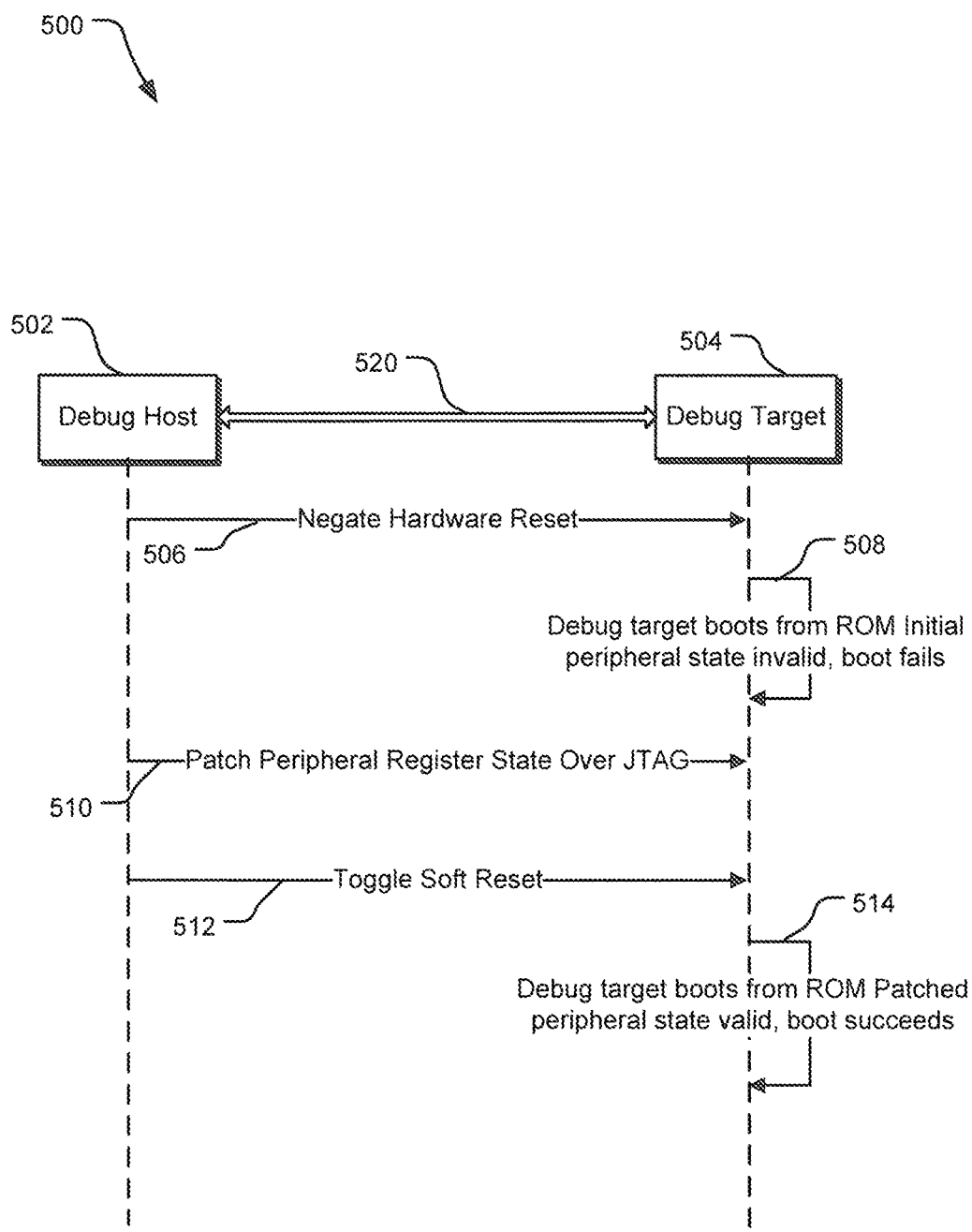
FIG. 5 illustrates example communications between a hardware debug host and a debug target disclosed herein.

FIG. 5 illustrates communications 500 between a DH 502 and a DT 504 to patch default registers in the DT 504. The DH 502 may be programmed to generate the correct waveforms on its debug ports to automatically perform one or more functions including, correcting default register settings on the DT 504 allowing the DT 504 to boot correctly. Occasionally register defaults in the DT 504 are chosen incorrectly that may otherwise prevent the DT 504 from being able to boot and start executing software. By leveraging a hardware debug bus 520, the default settings for those registers of the DT 504 can be changed allowing the software to boot correctly. The hardware debug bus 520 may be a JTAG bus, and SWD bus, etc. For example, the hardware debug bus 520 may be connected to hardware debug ports of the DT 504. Specifically, the interface between the DH 502 and DT 504 and algorithms stored on the DH 502 to generate the appropriate debug interface waveforms on a closed system allows such patching of the registers on the DT 504.

At 506 the DH 502 sends a negate hardware reset signal to the DT 504 over the hardware debug bus 520. At 508 the DT 504 boots from DT ROM. During such boot, if an initial peripheral state in a register of the DT 504 is invalid, the boot may fail. At 510, the DH 502 patches the peripheral register state of the DT 504 over the hardware debug bus 520. Patching the peripheral register state may involve communicating a correct peripheral register state to the DT 504 over the hardware debug bus 520. At 512, the DH 502 sends a toggle soft reset signal to the DT 504 over the hardware debug bus 520. At 514, the DT 504 boots from the DT ROM. Because the patched peripheral registers on the DT 504 are valid now, the boot succeeds.

Figure 6:
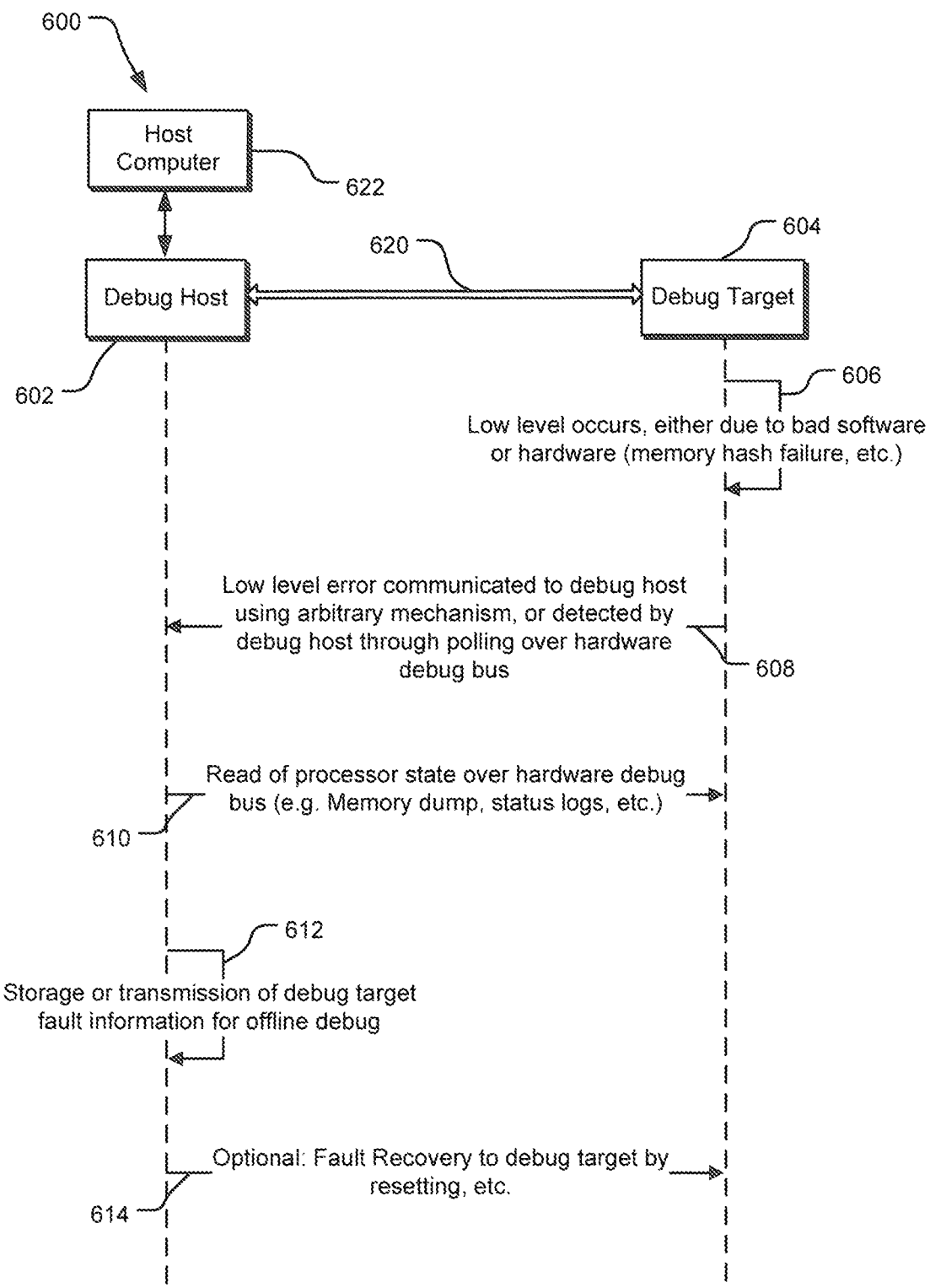
FIG. 6 illustrates alternative example communications between a hardware debug host and a debug target disclosed herein.

FIG. 6 illustrates communications 600 between a DH 602 and a DT 604 to perform failure analysis of the DT 604. Specifically, the communications 600 allows to analyze and possibly recover from complex low-level hardware and software faults on the DT 604. By leveraging a hardware debug bus 620, the DH 602 is able to analyze and possibly recover the DT 604 from complex low-level hardware and software faults on the DT 604. The hardware debug bus 620 may be a JTAG bus, and SWD bus, etc. For example, the hardware debug bus 620 may be connected to hardware debug ports of the DT 604. The DH 602 may automatically interrogate failure information on the DT 604 via the hardware debug bus 620 during a hardware failure on DT 604. For example, the DT hardware failure may be a Check-stop or red-light condition, a SyncFlood condition, a Lockup condition, etc.

In one implementation, the DH 602 detects the fault on the DT 604 either by polling state on the DT 604 over the hardware debug bus 620 or by using another out-of-band mechanism (Lockup/Checkstop GPIO, SyncHood PCIE transaction, etc.). The DH 602 is then able to read processor state of the DT 604, including a memory dump, register and memory mapped I/O (MMIO) state, etc. The DH 602 can then optionally attempt to recover the DT 604 through various degrees of altering the program execution state. For example, the DH 602 can read the program state of the DT 604 at the time of the fault, determine, and take different recovery actions based upon this state.

At 606, the DT 604 encounters a low level due to bad software or hardware, such as memory hash failure, etc. At 608, the low level is communicated to the DH 602 using the hardware debug bus 620. Alternatively, the DH 602 may detect the low level through polling over the hardware debug bus 620. At 610, the DH 602 reads one or more processor states of the DT 604 over the hardware debug bus 620. Such states may include, for example, memory dump, status logs, etc. At 612, the DH 602 stores or transmits the DT fault information for offline debug. For example, the DH 602 may transmit the DT fault information for offline debug to a host 622. Optionally, at 614, fault recovery procedure of the DT 604 may be communicated to the DT 604. Subsequently, the DT 604 may be reset.

Figure 7:
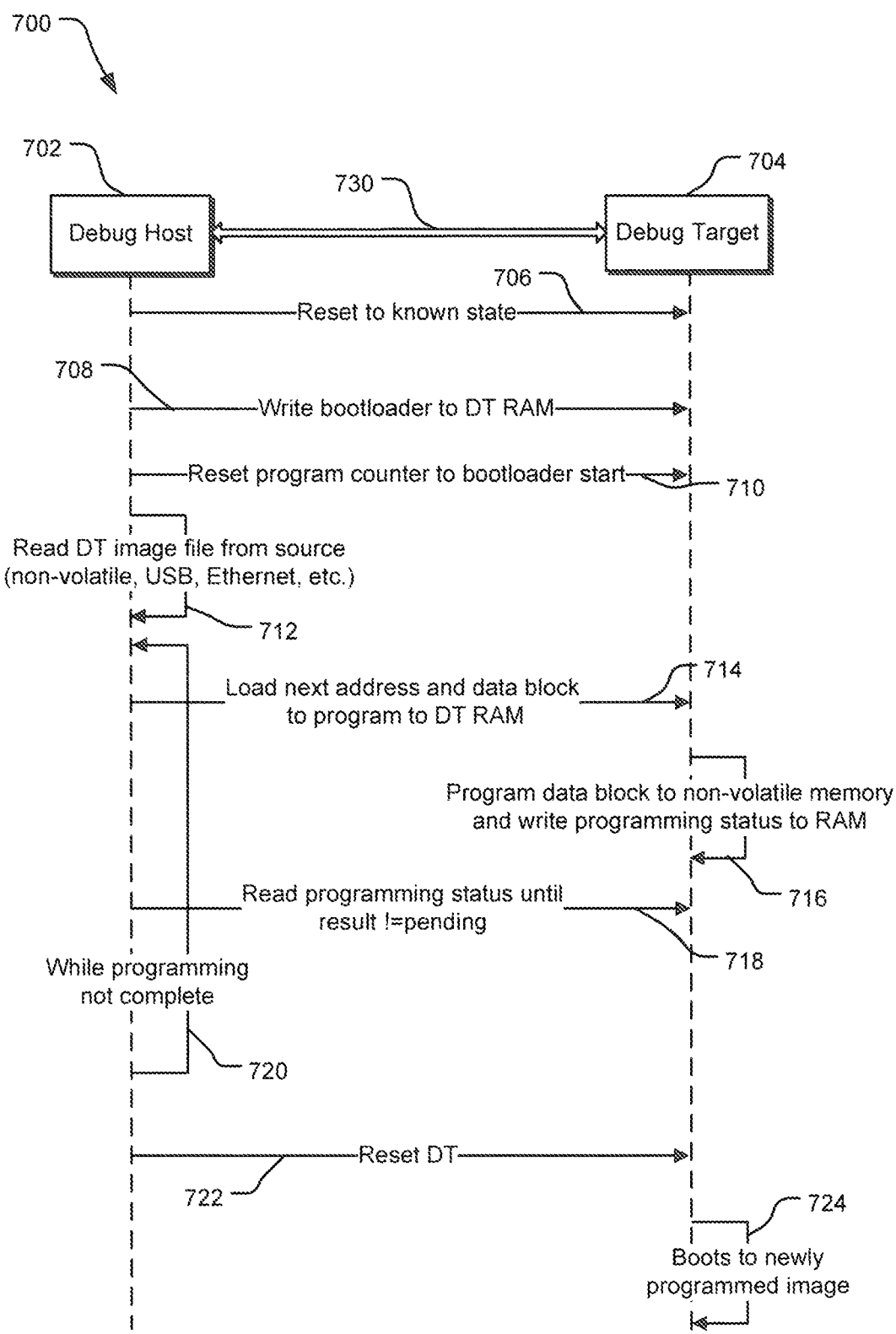
FIG. 7 illustrates alternative example communications between a hardware debug host and a debug target disclosed herein.

FIG. 7 illustrates communications 700 between a DH 702 and a DT 704 to update or recover a corrupt software image DT 704 using a hardware debug bus 730. The hardware debug bus 730 may be a JTAG bus, a SWD bus, etc. For example, the hardware debug bus 730 may be connected to hardware debug ports of the DT 704. Specifically, the communications 700 provides to update or recover a corrupt software image on the DT 702 using the hardware debug bus 730. The DH 702 can perform the initial programming, update, and recovery of corrupt software running on the DT 704 using the hardware debug bus 730. The DH 702 does this by loading a bootloader to the RAM of the DT 704 using the hardware debug bus 730. The DH 702 then reads the image file and copies the first block to the RAM of the DT 704. The bootloader running on the DT 704 writes the first block to the designated location in non-volatile storage, and writes the result of this programming operation to its RAM to be read by the DH 702 over the hardware debug bus 730. The DH 702 then proceeds to the next block of image data until the image is complete. The DH 702 then resets the DT 704 into the newly programmed image.

At 706, a reset to known state signal is sent from the DH 702 to the DT 704 over the hardware debug bus 730. At 708 a bootloader is sent to the RAM of the DT 704 over the hardware debug bus 730. At 710, a program counter of the DT 704 is reset to bootloader start. For example, the DH 702 may perform such program counter reset using the over the hardware debug bus 730. At 712, the DH 702 reads an image file of the corrupt software on the DT 704 from a source such as a non-volatile memory, a USB, the Ethernet, etc. For example, the operation 712 may read a copy of the corrupt software from a host. At 714, the DT 702 loads a first data block from the copy of the image file and an address where it is to be copied in the DT 704 to program the DT 704.

At 716 the DT 704 programs the data block at the address to non-volatile memory of the DT 704 and writes programming status to RAM. At 718 the DH 702 reads the programming status of the DT 704 until the result is not "pending." Once the programming status is read as "not pending, at 720 control is transferred back to 714 to load the next address and data block of the image to program the DT 704. Once all blocks of the image file are loaded on the RAM of the DT 704, At 722, the DH 702 sends a reset signal to the DT 704 and at 724, the DT 704 boots using the newly programmed image.

The operations 700 may also be used to load an application firmware directly into the DT 704 RAM without requiring any volatile memory on the DT 704. For example, the DH 702 may read a DT application firmware at 712 and load the data blocks of the DT application firmware to the DT 704 RAM at 714 via the hardware debug bus.

Figure 8:
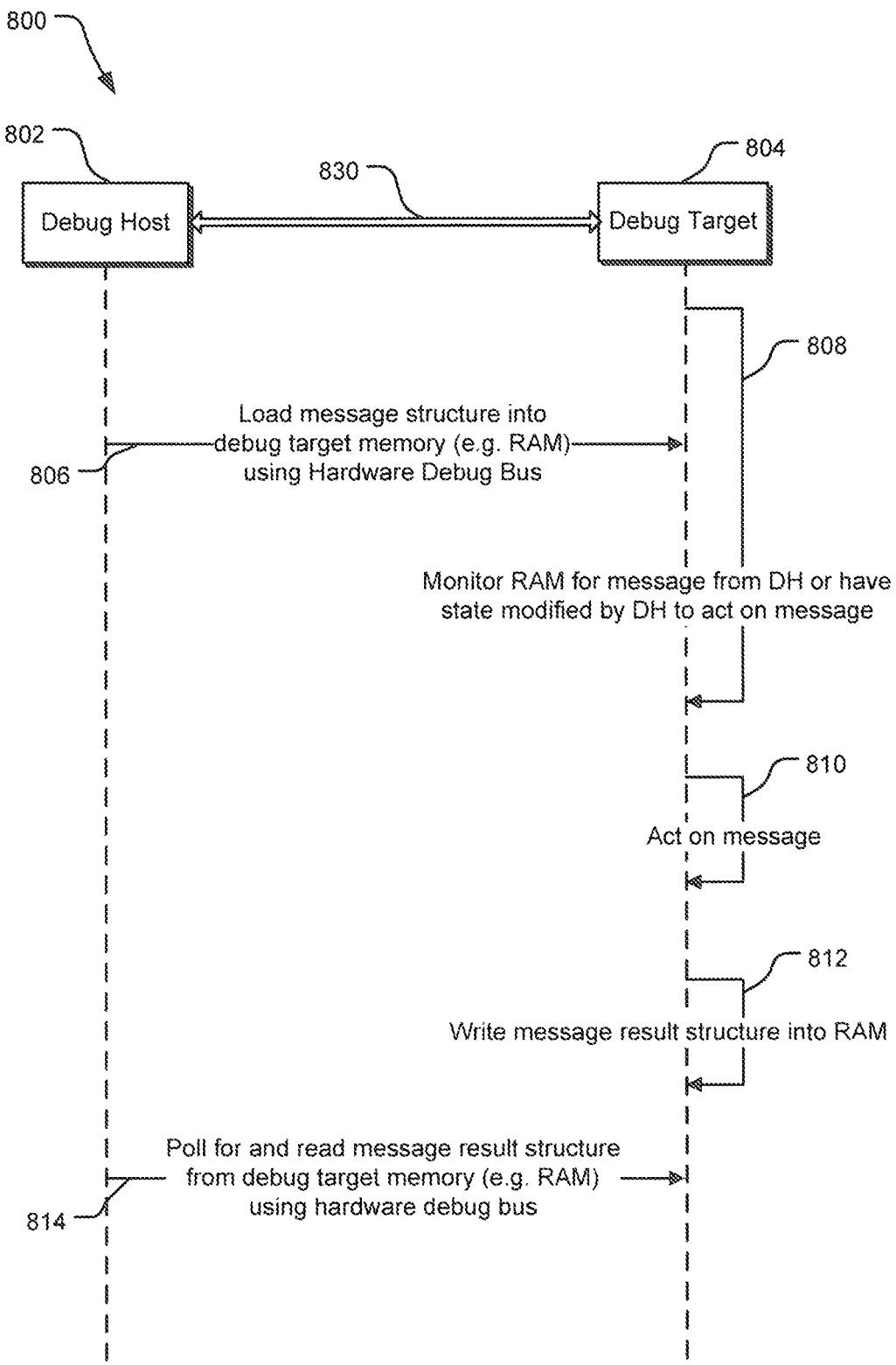
FIG. 8 illustrates alternative example communications between a hardware debug host and a debug target disclosed herein.

FIG. 8 illustrates communications 800 between a DH 802 and a DT 804 using a hardware debug bus 830. The hardware debug bus 830 may be a JTAG bus, a SWD bus, etc. For example, the hardware debug bus 830 may be connected to hardware debug ports of the DT 804. Specifically, the communications 800 enables a communication interface between the DT 804 and DH 802. The DH 802 may load a message structure into the memory of the DT 804. The DT 804 may then either poll this message structure to act on it. Alternatively, the DH 802 may modify the current execution state of the DT 804 (program counter, stack, etc.) using the hardware debug bus 830 to act upon this message. Once the message is acted upon, the result is written by the DT 804 into its own memory while the DH 802 polls for its availability.

At 806, the DH 802 loads a message structure into the memory of the DT 804 using the hardware debug bus 830. At 808, the DT 804 monitors its RAM for a message from the DH 802 or have a state modified by the DH 802 to act on the message. At 810 the DT 804 acts on the message. At 812, the DT 812 writes a message result structure into the RAM. At 814, the DH 802 polls the DT 804 and reads the message result structure from the RAM of the DT 804 using the hardware debug bus 830.

The hardware DH system disclosed herein provides a number of features including:

Developing a closed system where one chip (DH) is connected to another chip's (DT) hardware debug port.
Using the DH to automatically load correct settings into the DT that enable it to boot via the hardware debug port.
Using the DH to automatically interrogate failure information during a hardware failure such as a Checkstop, SyncHood, Lockup, etc., via the hardware debug port.
Using the DH to automatically recover, or record debug information from a software programming error that creates a deadlock, infinite loop, etc., via the hardware debug port.
Using the DH to program the initial DT image, update that image, and recover the DT from a corrupted image.
Using the DH to load an application firmware directly into the DT's RAM without requiring nonvolatile memory on the DT, allowing the DT to be less expensive.
Enabling the DH to communicate information with the DT via the hardware debug port.

Figure 9:
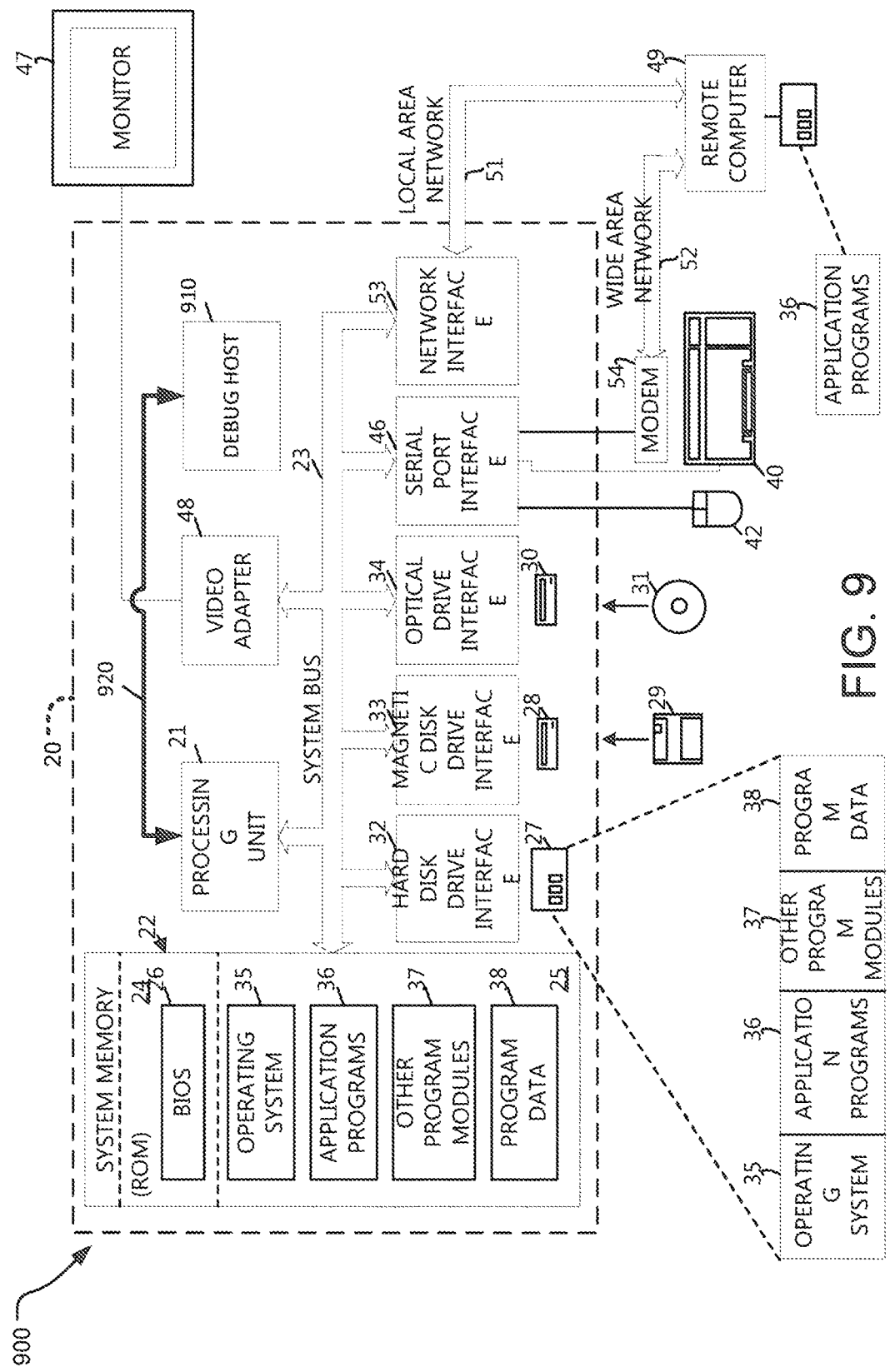
FIG. 9 illustrates an example system that may be useful in implementing the hardware debug system disclosed herein

FIG. 9 illustrates an example system 900 that may be useful in implementing the hardware debug system disclosed herein. The example hardware and operating environment of FIG. 9 for implementing the described technology includes a computing device, such as a general-purpose computing device in the form of a computer 20, a mobile telephone, a personal data assistant (PDA), a tablet, smart watch, gaming remote, or other type of computing device. In the implementation of FIG. 9, for example, the computer 20 includes a processing unit 21, a system memory 22, and a system bus 23 that operatively couples various system components including the system memory to the processing unit 21. There may be only one or there may be more than one processing unit 21, such that the processor of a computer 20 comprises a single central-processing unit (CPU), or a plurality of processing units, commonly referred to as a parallel processing environment. The computer 20 may be a conventional computer, a distributed computer, or any other type of computer; the implementations are not so limited.

In the example implementation of the computing system 900, the computer 20 also includes a debug host 910 such as a hardware debug host disclosed herein. The debug host 910 may communicate with the processing unit 21 via a communications bus 920 such as a JTAG bus, an SWD bus, etc. In such an implementation, the debug host 910 may be able to debug the processing unit 21, set registers in the processing unit 21, add one or more programs to the processing unit 21, etc.

The system bus 23 may be any of several types of bus structures including a memory bus or memory controller, a peripheral bus, a switched fabric, point-to-point connections, and a local bus using any of a variety of bus architectures. The system memory may also be referred to as simply the memory, and includes read-only memory (ROM) 24 and random access memory (RAM) 25. A basic input/output system (BIOS) 26, containing the basic routines that help to transfer information between elements within the computer 20, such as during start-up, is stored in ROM 24. The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM, DVD, or other optical media.

The computer 20 may be used to implement a signal sampling module configured to generate sampled signals based on the reflected modulated signal 72 as illustrated in FIG. 1. In one implementation, a frequency unwrapping module including instructions to unwrap frequencies based on the sampled reflected modulations signals may be stored in memory of the computer 20, such as the read-only memory (ROM) 24 and random access memory (RAM) 25, etc.

The hard disk drive 27, magnetic disk drive 28, and optical disk drive 30 are connected to the system bus 23 by a hard disk drive interface 32, a magnetic disk drive interface 33, and an optical disk drive interface 34, respectively. The drives and their associated tangible computer-readable media provide nonvolatile storage of computer-readable instructions, data structures, program modules and other data for the computer 20. It should be appreciated by those skilled in the art that any type of tangible computer-readable media may be used in the example operating environment.

A number of program modules may be stored on the hard disk, magnetic disk 29, optical disk 31, ROM 24, or RAM 25, including an operating system 35, one or more application programs 36, other program modules 37, and program data 38. A user may generate reminders on the personal computer 20 through input devices such as a keyboard 40 and pointing device 42. Other input devices (not shown) may include a microphone (e.g., for voice input), a camera (e.g., for a natural user interface (NUI)), a joystick, a game pad, a satellite dish, a scanner, or the like. These and other input devices are often connected to the processing unit 21 through a serial port interface 46 that is coupled to the system bus, but may be connected by other interfaces, such as a parallel port, game port, or a universal serial bus (USB). A monitor 47 or other type of display device is also connected to the system bus 23 via an interface, such as a video adapter 48. In addition to the monitor, computers typically include other peripheral output devices (not shown), such as speakers and printers.

The computer 20 may operate in a networked environment using logical connections to one or more remote computers, such as remote computer 49. These logical connections are achieved by a communication device coupled to or a part of the computer 20; the implementations are not limited to a particular type of communications device. The remote computer 49 may be another computer, a server, a router, a network PC, a client, a peer device or other common network node, and typically includes many or all of the elements described above relative to the computer 20. The logical connections depicted in FIG. 9 include a local-area network (LAN) 51 and a wide-area network (WAN) 52. Such networking environments are commonplace in office networks, enterprise-wide computer networks, intranets and the Internet, which are all types of networks.

When used in a LAN-networking environment, the computer 20 is connected to the local area network 51 through a network interface or adapter 53, which is one type of communications device. When used in a WAN-networking environment, the computer 20 typically includes a modem 54, a network adapter, a type of communications device, or any other type of communications device for establishing communications over the wide area network 52. The modem 54, which may be internal or external, is connected to the system bus 23 via the serial port interface 46. In a networked environment, program engines depicted relative to the personal computer 20, or portions thereof, may be stored in the remote memory storage device. It is appreciated that the network connections shown are example and other means of communications devices for establishing a communications link between the computers may be used.

In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Some embodiments of the hardware debug system may comprise an article of manufacture. An article of manufacture may comprise a tangible storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

The hardware debug system disclosed herein may include a variety of tangible computer-readable storage media and intangible computer-readable communication signals. Tangible computer-readable storage can be embodied by any available media that can be accessed by the hardware debug system disclosed herein and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the hardware debug system disclosed herein. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals moving through wired media such as a wired network or direct-wired connection, and signals moving through wireless media such as acoustic, RF, infrared and other wireless media.

A hardware debug system includes a target chip comprising one or more target chip registers and one or more target chip ports, wherein at least one of the one or more target chip ports is used as a target chip debug port, and a debug host with one or more debug host ports, wherein at least one of the one or more debug host ports is connected to the target chip debug port via a hardware debug bus, wherein the debug host is configured to load at least one target chip setting into the one or more target chip registers that enables the target chip to boot via the hardware debug port using the hardware debug bus.

An implementation of the hardware debug apparatus includes a target chip comprising one or more target chip registers and one or more target chip ports, wherein at least one of the one or more target chip ports is used as a target chip debug port, and a debug host with one or more debug host ports, wherein at least one of the one or more debug host ports is connected to the target chip debug port via a hardware debug bus, wherein the debug host is configured to load at least one target chip setting into the one or more target chip registers that enables the target chip to boot via the hardware debug port using the hardware debug bus. In an alternative implementation, the debug host is configured to interrogate failure information during a hardware failure of the target chip from the target chip debug port using the hardware debug bus. In yet another implementation, the debug host is further configured to patch default registers in the target chip by communicating a peripheral register state to the target chip over the hardware debug bus.

In an implementation of the hardware debug apparatus, the debug host is further configured to recover the target chip from a target chip software programming error by communicating with the target chip over the hardware debug bus to read one or more processor states of the target chip. In another implementation, the debug host is further configured to recover the target chip from a target chip software programming error by communicating a fault recovery procedure to the target chip over the hardware debug bus. Yet alternatively, the debug host is further configured to update a corrupt software image on the target chip using the hardware debug bus. In one implementation, the debug host is further configured to update the corrupt software image on the target chip by iteratively programming a plurality of data blocks on a non-volatile memory of the target chip over the hardware debug bus. In an example implementation, the hardware debug bus is at least one of JTAG bus and a SWD bus. Alternatively, the debug host is further configured to load an application firmware into the target chip using the hardware debug bus.

A hardware debug system disclosed herein includes a debug target (DT) including one or more DT registers and one or more DT debug ports, wherein at least one of the one or more DT ports are connected to a hardware debug bus and a debug host (DH) configured to store one or more peripheral register states on the DT registers via the hardware debug bus. In one implementation, the hardware debug bus is at least one of JTAG bus and a SWD bus. Alternatively, the DH is further configured to update a corrupt software on the DT by iteratively loading an updated copy of the software on the DT via the hardware debug bus. Yet alternatively, the DH is further configured to load an application firmware into the target chip using the hardware debug bus.

In another implementation, the DH is further configured to communicate a fault recovery procedure to the DT over the hardware debug bus. In one implementation, the DH is further configured to patch default registers in the DT by communicating a negate hardware reset signal over the hardware debug bus to the DT, communicating an updated peripheral register state to the DT over the hardware debug bus, and toggling a soft-reset signal on the hardware debug bus to the DT.

A debug host (DH) includes a plurality of general purpose IO (GPIO) ports, wherein the GPIO ports are configured to communicate to one or more debug ports of a debug target (DT) via a hardware debug bus, wherein the DH is configured to load at least one DT setting into the one or more DT registers that enables the DT to boot via the hardware debug port using the hardware debug bus. In one implementation, the DH is further configured to interrogate failure information during a hardware failure of the DT from the DT debug port using the hardware debug bus. Alternatively, the DH is further configured update a corrupt software image on the DT using the hardware debug bus. Yet alternatively, the DH is further configured update the corrupt software image on the target chip by iteratively programming a plurality of data blocks on a non-volatile memory of the target chip over the hardware debug bus. In one implementation, the hardware debug bus is at least one of JTAG bus and a SWD bus.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. An apparatus comprising:
  a target chip comprising one or more target chip registers and one or more target chip ports, wherein at least one of the one or more target chip ports is used as a target chip debug port; and
  a debug host with one or more debug host ports, wherein at least one of the one or more debug host ports is connected to the target chip debug port via a hardware debug bus,
  wherein the debug host is configured to load at least one target chip boot setting into the one or more target chip registers that enables the target chip to boot via a hardware debug port using the hardware debug bus.

2. The apparatus of claim 1, wherein the debug host is configured to interrogate failure information during a hardware failure of the target chip from the target chip debug port using the hardware debug bus.

3. The apparatus of claim 1, wherein the debug host is further configured to patch default registers in the target chip by communicating a peripheral register state to the target chip over the hardware debug bus.

4. The apparatus of claim 1, wherein the debug host is further configured to recover the target chip from a target chip software programming error by communicating with the target chip over the hardware debug bus to read one or more processor states of the target chip.

5. The apparatus of claim 4, wherein the debug host is further configured to recover the target chip from a target chip software programming error by communicating a fault recovery procedure to the target chip over the hardware debug bus.

6. The apparatus of claim 1, wherein the debug host is further configured to update a corrupt software image on the target chip using the hardware debug bus.

7. The apparatus of claim 6, wherein the debug host is further configured to update the corrupt software image on the target chip by iteratively programming a plurality of data blocks on a non-volatile memory of the target chip over the hardware debug bus.

8. The apparatus of claim 1, wherein the hardware debug bus is at least one of Joint Test Action Group (JTAG) bus and a serial wire debug (SWD) bus.

9. The apparatus of claim 1, wherein the debug host is further configured to load an application firmware into the target chip using the hardware debug bus.

10. A hardware debug system, comprising:
    a debug target (DT) including one or more DT registers and one or more DT debug ports, wherein at least one of the one or more DT ports are connected to a hardware debug bus; and
    a debug host (DH) configured to store one or more peripheral register states on the DT registers via the hardware debug bus, wherein the debug host is configured to load at least one target chip boot setting into the one or more target chip registers.

11. The hardware debug system of claim 10, wherein the hardware debug bus is at least one of Joint Test Action Group (JTAG) bus and a serial wire debug (SWD) bus.

12. The hardware debug system of claim 10, wherein the DH is further configured to update a corrupt software on the DT by iteratively loading an updated copy of the software on the DT via the hardware debug bus.

13. The hardware debug system of claim 10, wherein the DH is further configured to load an application firmware into a target chip using the hardware debug bus.

14. The hardware debug system of claim 10, wherein the DH is further configured to communicate a fault recovery procedure to the DT over the hardware debug bus.

15. The hardware debug system of claim 10, wherein the DH is further configured to patch one or more default registers in the DT by:
    communicating a negate hardware reset signal over the hardware debug bus to the DT,
    communicating an updated peripheral register state to the DT over the hardware debug bus, and
    toggling a soft-reset signal on the hardware debug bus to the DT.

16. A debug host (DH), comprising:
    plurality of general purpose IO (GPIO) ports, wherein the GPIO ports are configured to communicate to one or more debug ports of a debug target (DT) via a hardware debug bus, wherein the DH is configured to load at least one DT boot setting into one or more DT registers that enables the DT to boot via a hardware debug port using the hardware debug bus.

17. The DH of claim 16, wherein the DH is further configured to interrogate failure information during a hardware failure of the DT from the DT debug port using the hardware debug bus.

18. The DH of claim 16, wherein the DH is further configured update a corrupt software image on the DT using the hardware debug bus.

19. The DH of claim 18, wherein the DH is further configured update the corrupt software image on the target chip by iteratively programming a plurality of data blocks on a non-volatile memory of the target chip over the hardware debug bus.

20. The DH of claim 16, wherein the hardware debug bus is at least one of Joint Test Action Group (JTAG) bus and a serial wire debug (SWD) bus.

* * * * *